(12) United States Patent
Lu

(10) Patent No.: US 6,228,722 B1
(45) Date of Patent: May 8, 2001

(54) METHOD FOR FABRICATING SELF-ALIGNED METAL SILCIDE

(75) Inventor: Chin-Yu Lu, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/293,433

(22) Filed: Apr. 16, 1999

(51) Int. Cl.[7] .................................................. H01L 21/336
(52) U.S. Cl. .......................... 438/279; 438/523; 438/533; 438/655; 438/323; 438/592; 438/646
(58) Field of Search .................................. 438/279, 523, 438/533, 532, 591, 652, 655, 657, 323, 324, 592, 585, 651, 646, 682

(56) References Cited

U.S. PATENT DOCUMENTS

| | | | |
|---|---|---|---|
| 4,753,897 | * 6/1988 | Lund et al. | 437/41 |
| 5,429,969 | * 7/1995 | Chang | 437/43 |
| 5,712,196 | * 1/1998 | Ibok | 437/200 |
| 6,060,387 | * 5/2000 | Shepela et al. | 438/630 |
| 6,083,828 | * 7/2000 | Lin et al. | 438/639 |
| 6,093,589 | * 7/2000 | Lo et al. | 438/197 |
| 6,096,642 | * 5/2000 | Wu | 438/655 |

* cited by examiner

Primary Examiner—Matthew Smith
Assistant Examiner—Renzo N. Rocchegiani
(74) Attorney, Agent, or Firm—Jiawei Huang; J. C. Patents

(57) ABSTRACT

A method of fabricating a self-aligned metal silicide. Two neighboring gates are formed on a substrate, and each of the gates comprises a cap layer thereon. Source/drain regions are formed in the substrate. The source/drain regions comprise a common source/drain region between these two gates. A metal suicide layer is formed on the source/drain region. A first insulation layer is formed to cover the source/drain regions. The cap layer is removed, followed by a pre-amorphous implantation process. A metal silicide layer is formed on the gate. A passivation is formed to protect the metal silicide layer on the gate. A second insulation layer is formed to cover the passivation layer and the first insulation layer. The second and the first insulation layers are patterned to form a contact window to expose the common source/drain region.

8 Claims, 10 Drawing Sheets

METHOD FOR FABRICATING SELF-ALIGNED METAL SILCIDE

BACKGROUND OF THE INVENTION

1. Field of the Invention

The invention relates to a fabrication process of self-aligned metal silicide (salicide). More particularly, the invention relates to a method of fabricating salicide of a self-aligned contact without causing the problems such of bridge effect and junction leakage.

2. Description of the Related Art

As the integrated circuits have been continuously developed to achieve a higher integration, the linewidth, contact area, and junction depth of the integrated circuits or the devices thereon have to be scaled down. To effectively enhance the performance of devices, the resistance is reduced to minimize signal transmission delay caused by the resistance and capacitance. It is therefore a trend for fabricating a metal sicilide at a junction to reduce the contact resistance. However, many structures or patterns are formed by only one step of photolithography, therefore, the alignment tolerance of photolithography thus becomes smaller for the smaller devices. Consequently, a fabrication process with a self-aligned effect such as fabrication process for forming a self-aligned metal silicide layer and self-aligned contact window becomes more and more important.

Between two neighboring spacers of two neighboring gates, a self-aligned contact window is formed under the conditions of a large selectivity between the spacers and an insulation layer, and the formation of cap layers to protect the gates. With the cap layers, the alignment window for photolithography is widened, and the gates are protected from being damaged while etching the insulation layer. On the other hand, a MOS transistor is formed in advance when a self-aligned contact window is formed to expose a gate of the MOS transistor. A metal is sputtered onto the MOS transistor which has been formed in advance, followed by reacting into a metal silicide layer. The cap layers on the gates thus encumber the reaction of the metal layer, and therefore, inhibits the formation of the metal silicide layer. Though the gates may also be made of material with a low resistivity such as polycide, taking tungsten silicide as an example, the junction resistance between the polycide and the polysilicon of the gate is as high as 10 $\Omega$, which can not meet the requirement of a sub-micron technology. In addition, when the gates are implanted with doping material to adjust the conduction type of gate, doping material can not penetrate through the silicide layer. Therefore, it is more difficult to achieve the requirement of surface channel device for sub-quarter micron technology.

Titanium silicide ($TiSi_2$) is a material widely applied to form the metal silicide layer on the MOS transistor due to the low resistivity. In the thermal process for forming the titanium silicide layer, silicon is the moving species with a better mobility as the temperature raises. Moreover, the temperature for forming the titanium silicide layer can not be lower than 600° C. Thus, a great amount of the silicon atoms diffuses onto a surface of the spacer and reacts with the titanium to form titanium silicide on the spacer, a bridging effect is thus caused. More seriously, a short circuit may even occur between the gate and the source/drain region.

Another drawback of the titanium silicide formed by a conventional method is a narrow linewidth effect. That is, when the linewidth is under 0.25 $\mu$m, the sheet resistance is obviously increased as the reduction of gate linewidth. This is because the number of nucleation sites for transforming the high-resistance C-49 phase of titanium silicide into a low-resistance C-54 phase is limited. Typically, before sputtering the metal, a pre-amorphous implantation is performed to increase the nucleation sites. However, if conditions of the pre-amorphous implantation are not well controlled, plus silicon atoms tend to move towards to titanium during the formation of the titanium silicide, voids are formed in the source/drain region, and a junction leakage is evoked.

SUMMARY OF THE INVENTION

Accordingly, the invention provides a method of fabricating a self-aligned metal silicide layer, especially for use of a self-aligned contact window. The method provided in the invention eliminates the problems of bridging and junction leakage.

A polysilicon layer and a cap layer are formed on a substrate. At least two neighboring gates are formed after patterning the polysilicon layer and the cap layer. A spacer is formed on sidewalls of the gates, followed by forming source/drain regions in the substrate. The source/drain regions includes a common source/drain region between two neighboring spacers of this two neighboring gates. A metal layer is formed over the substrate, followed by a thermal process. A first metal silicide layer is thus formed on the source/drain regions. The remaining metal layer which does not react into the metal silicide layer is removed. A first insulation layer is formed over the substrate. The first insulation layer is planarized with the cap layer as a stop layer. The cap layer is removed to expose the polysilicon layer of the gates, and a pre-amorphous implantation is performed on the polysilicon layer. A second metal layer is formed over the substrate and covering the gates, and a second thermal process is performed, so that a second metal silicide layer is formed on the gates. The remaining metal layer which does not react with the polysilicon layer is removed. A passivation layer is formed over the substrate. Using the first insulation layer as a stop layer, the passivation layer is planarized. A second insulation layer is formed on the passivation layer. The second and the first insulation layers are patterned to form a contact window to expose the metal silicide layer covering the common source/drain region.

By the invention, the metal silicide layers are formed on the source/drain regions and the gates in different process steps. Therefore, the bridging effect can be resolved. Moreover, a pre-amorphous implantation step is performed on the gate only, so that the junction leakage of the source/drain region is not evoked like the conventional method.

It is to be understood that both the foregoing general description and the following detailed description are exemplary and explanatory only and are not restrictive of the invention, as claimed.

DESCRIPTION OF THE PREFERRED EMBODIMENTS

Figure 1A:
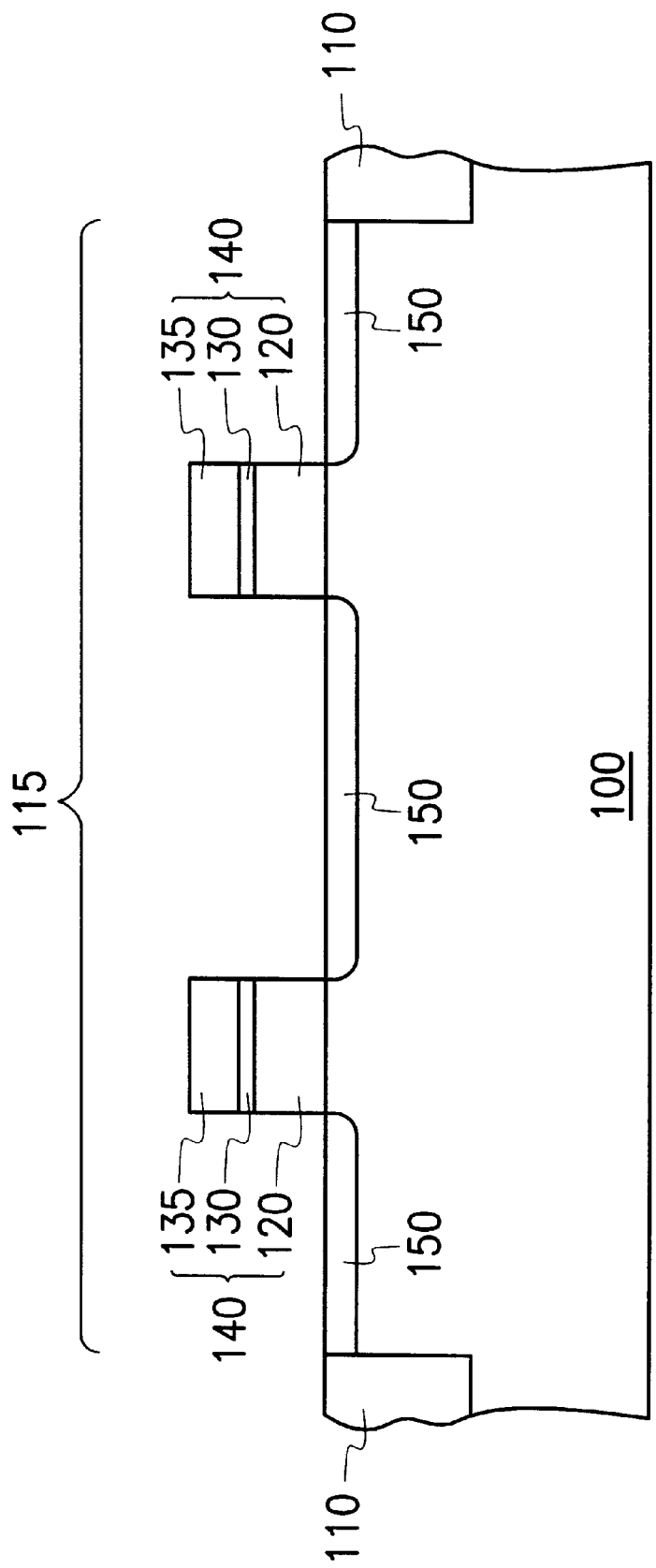
FIG. 1A to FIG. 1J shows a fabrication process forming a metal silicide layer according to a preferred embodiment of the invention.

In FIG. 1A, a substrate 100 comprising isolation structures 110, for example, local oxidation structures or a shallow isolation trenches, is provided. An active region 115 is defined by the isolation structures 110. A polysilicon layer 120, a buffer layer 130 and a cap layer 135 are formed on the active region 115. The polysilicon layer 120, the buffer layer 130, and the cap layer 135 are patterned to form one or more than one gate. In this embodiment, two neighboring gates 140 are formed, and a particular example of applying a self-aligned metal silicide layer to a self-aligned contact window is described. Using the gates 140 as masks, an ion implantation is performed on active region 115 of the substrate 100, so that lightly doped drain regions 150 are formed in the active region 115 of the substrate 100. The polysilicon layer can be formed by a chemical vapor deposition (CVD), for example. Preferably, the buffer layer 130 is made of silicon oxide, while the cap layer 135 comprises, for example, a silicon nitride layer formed by chemical vapor deposition.

Figure 1B:
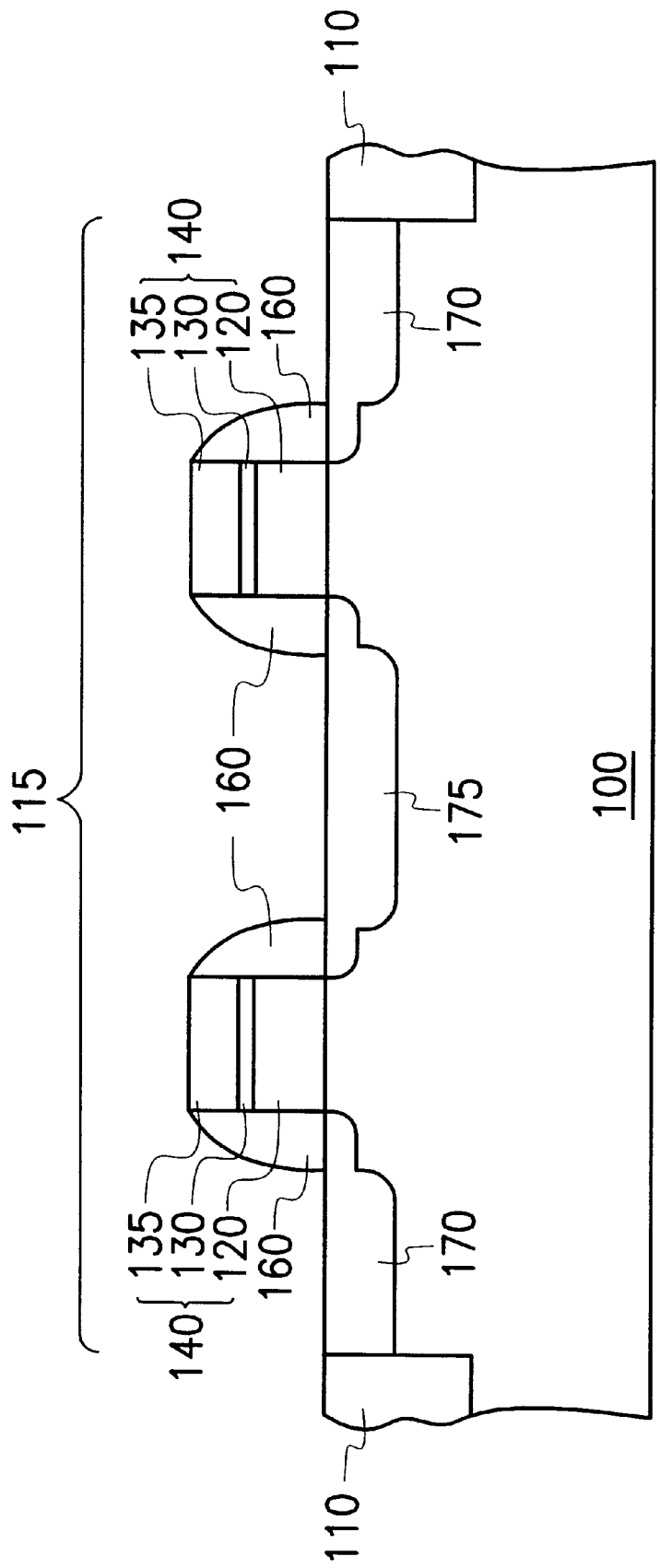

In FIG. 1B, spacers 160, for example, nitride spacers, are formed on sidewalls of the gates 140. Using the gates 140 and the spacers 160 as masks, an ion implantation is performed on the active region 115 of the substrate 100 to form source/drain regions 170 and 175. The source/drain regions 170 and 175 comprises a common source/drain region 175 shared between two neighboring gates 140.

Figure 1C:
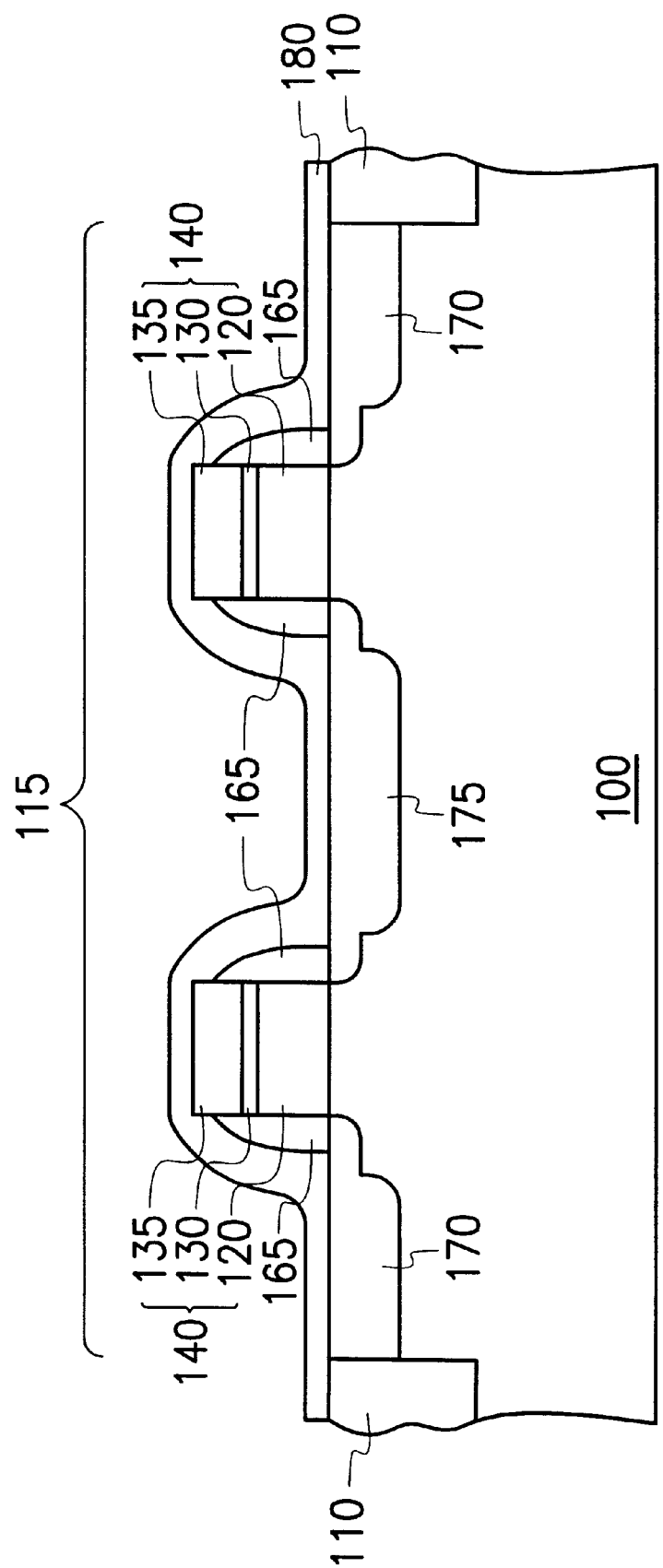

In FIG. 1C, to obtain a larger contact area, that is, to expose more surface area of the source/drain regions 170 and 175, the spacers 160 are etched to result as the spacers 165. Therefore, a part of the sidewalls of the gates 140 is exposed. A metal layer 180, for example, a titanium layer, a cobalt layer, or other refractory metals, is formed to cover the gates 140 and the source/drain regions 170 and 175 over the active region 115. The forming method of the metal layer 180 comprises, for example, a sputtering step. A metal nitride (not shown in the figure) may also be formed on the metal layer by, for example, sputtering or rapid thermal nitridation (RTN).

Figure 1D:
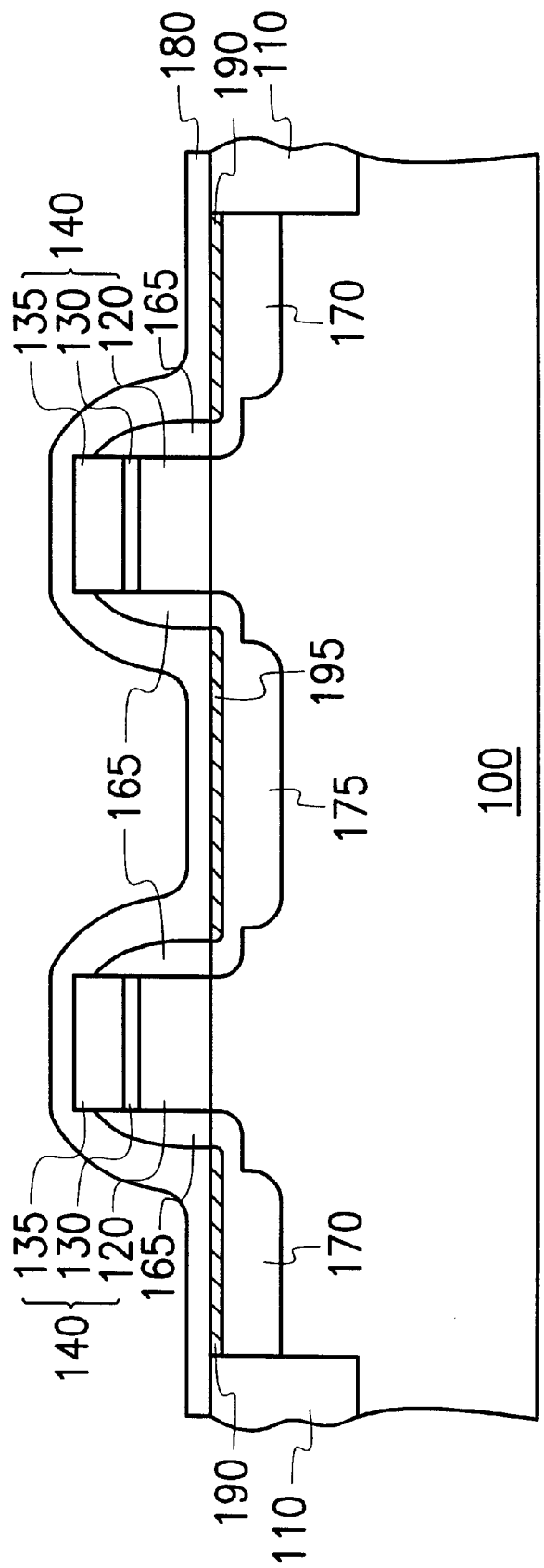

In FIG. 1D, a first thermal process is performed. Consequently, the metal layer 180 reacts with the source/drain regions 170 and 175 to produce a metal silicide layer 190 and 195, respectively. In the case of using a titanium layer as the metal layer 180, two stages are employed for the first thermal process. In the first stage, a temperature at about 620° C. to about 680° C. is maintained to form a titanium silicide layer in a C-49 phase. The second stage transforms the titanium silicide layer from the C-49 phase into a C-54 phase at a temperature ranged from about 800° C. to about 900° C.

Figure 1E:
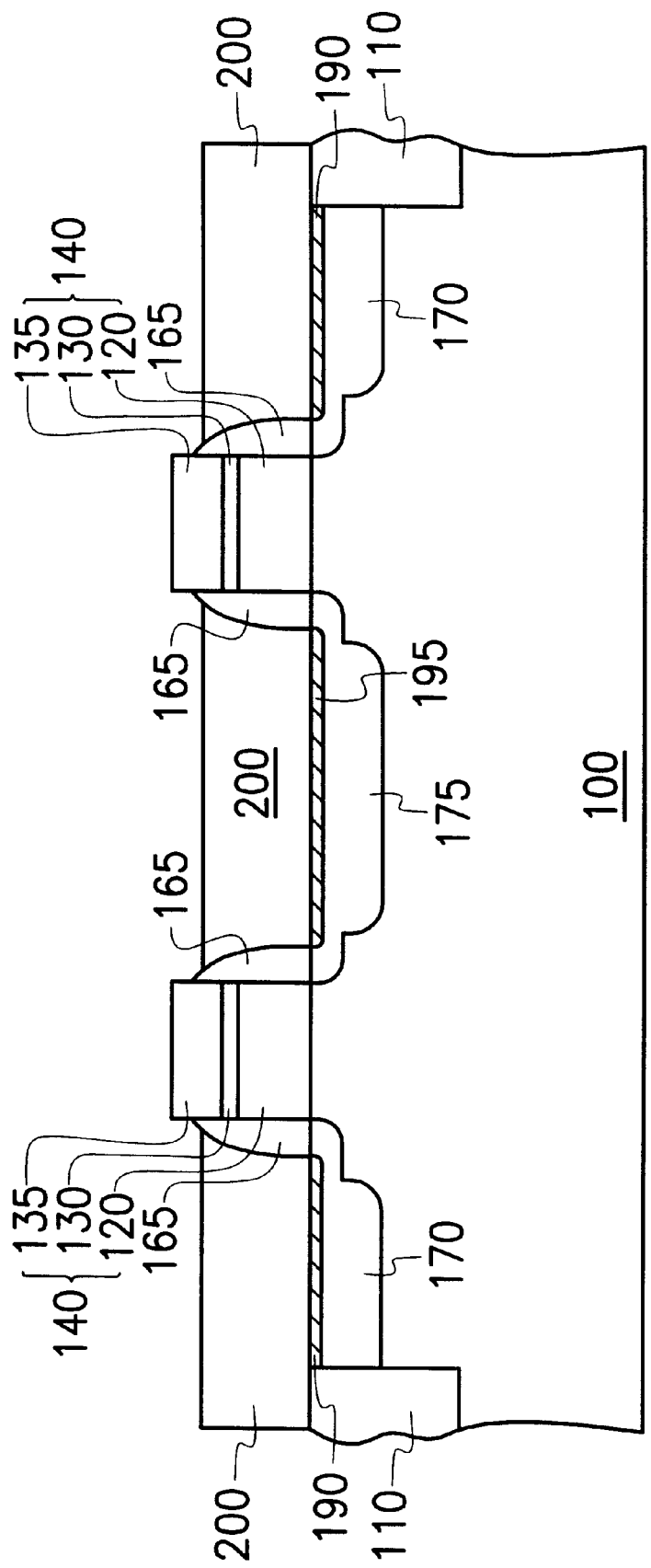

In FIG. 1E, the metal layer 180 which does not react with the source/drain regions 170 and 175 is removed. In case any metal nitride remaining on the on the metal layer 180, the metal nitride is removed with the metal layer 180. For example, solution of the $NH_3/H_2O_2$ is used for removing titanium. An insulation layer 200 is formed on the metal sicilide layer 190 and 195, the spacers 160, and the gates 140 over the substrate 100. Using the cap layer as a stop layer, the insulation layer 200 is planarized. That is, the removing rate of the insulation layer 200 is higher than that of the cap layer 135.

Figure 1F:
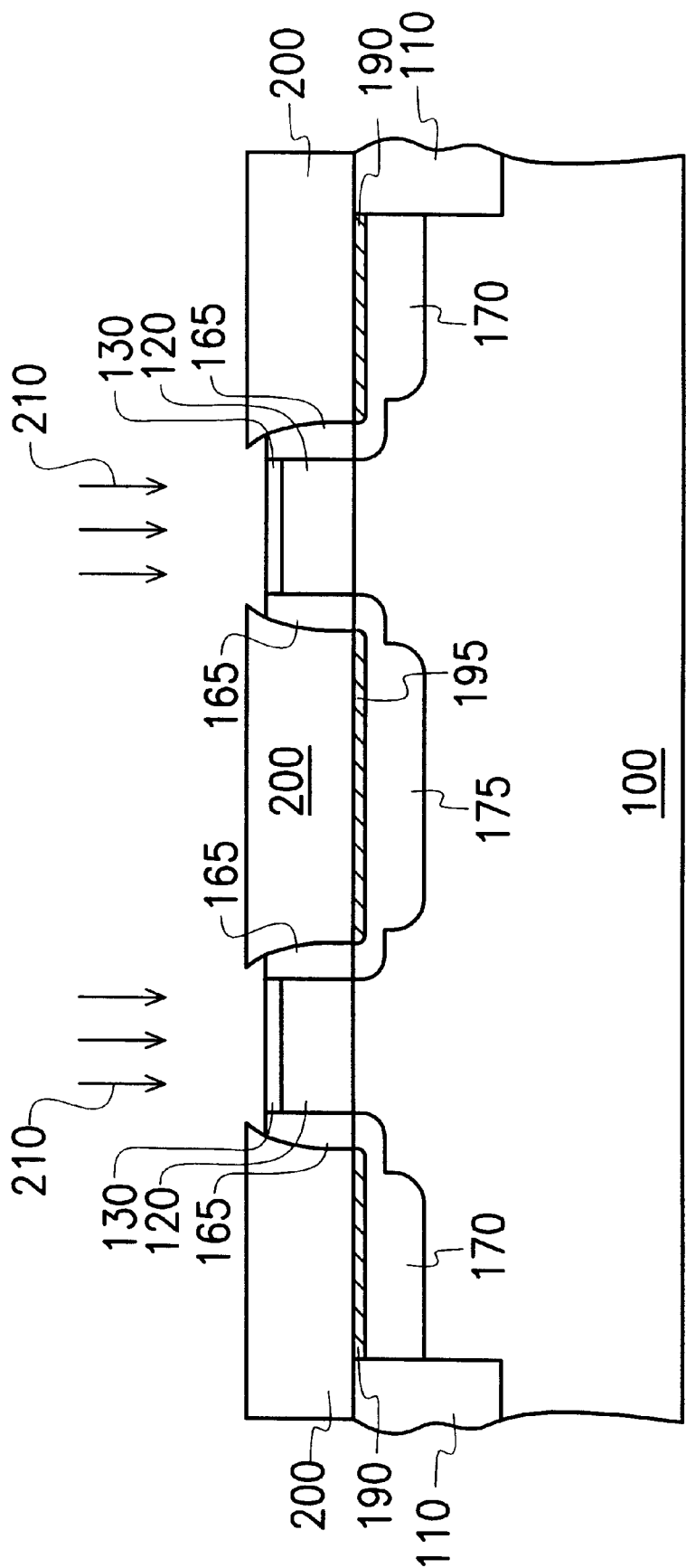

In FIG. 1F, the cap layer 135 is removed. While the cap layer 135 comprises material of silicon nitride, the cap layer 135 can be removed using hot phosphoric acid. However, if the spacers 160 also comprise silicon nitride, a part of the spacers 160 may also be removed. Using an ion source with a concentration of about $1\times10^{14}$ $cm^{-2}$, a pre-amorphous implantation step is performed on the polysilicon layer 120. The implantation energy is preferably about 30–40 KeV, so that a surface of the polysilicon layer 120 is transformed into an amorphous silicon layer.

Figure 1G:
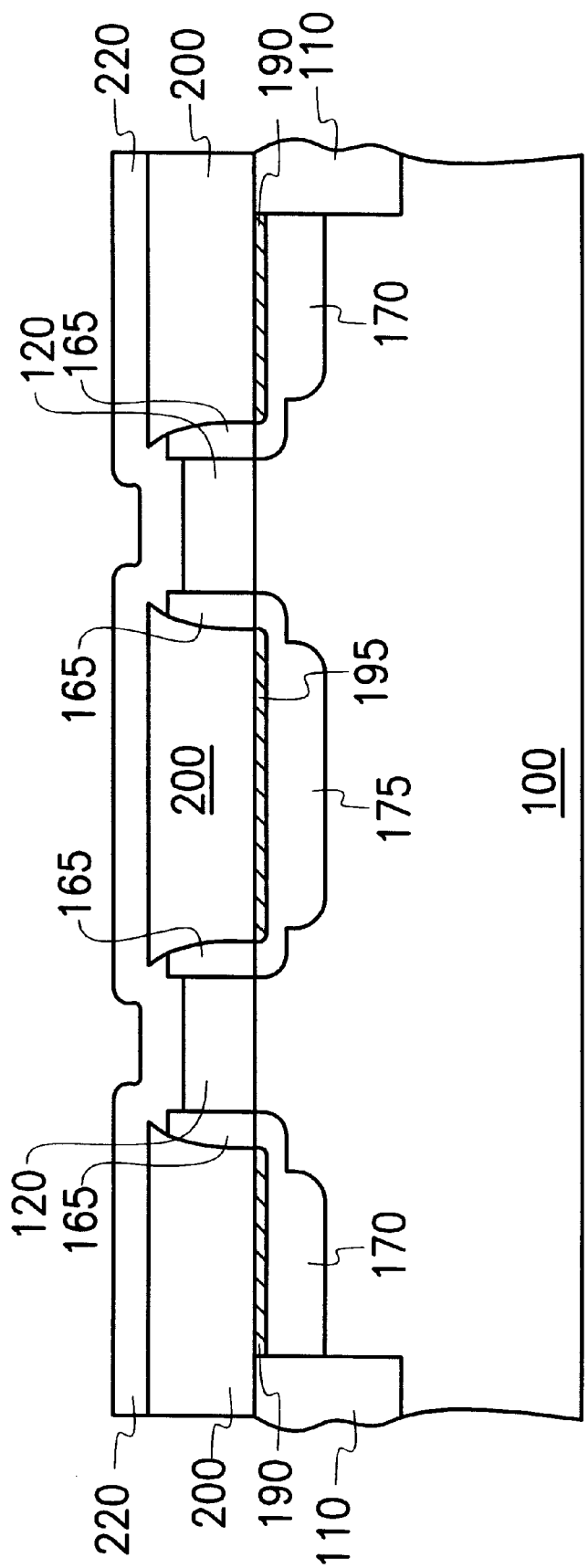

In FIG. 1G, the buffer layer 135 is removed. When the buffer layer 135 is made of silicon oxide, a solution of hydrogen fluoride (HF) is used for the removal process. A metal layer 220 is formed on the gates 140 and the insulation layer 200, for example, by sputtering. Again, a metal nitride layer may also be formed on the metal layer 220 by, for example, sputtering or rapid thermal nitridation.

Figure 1H:
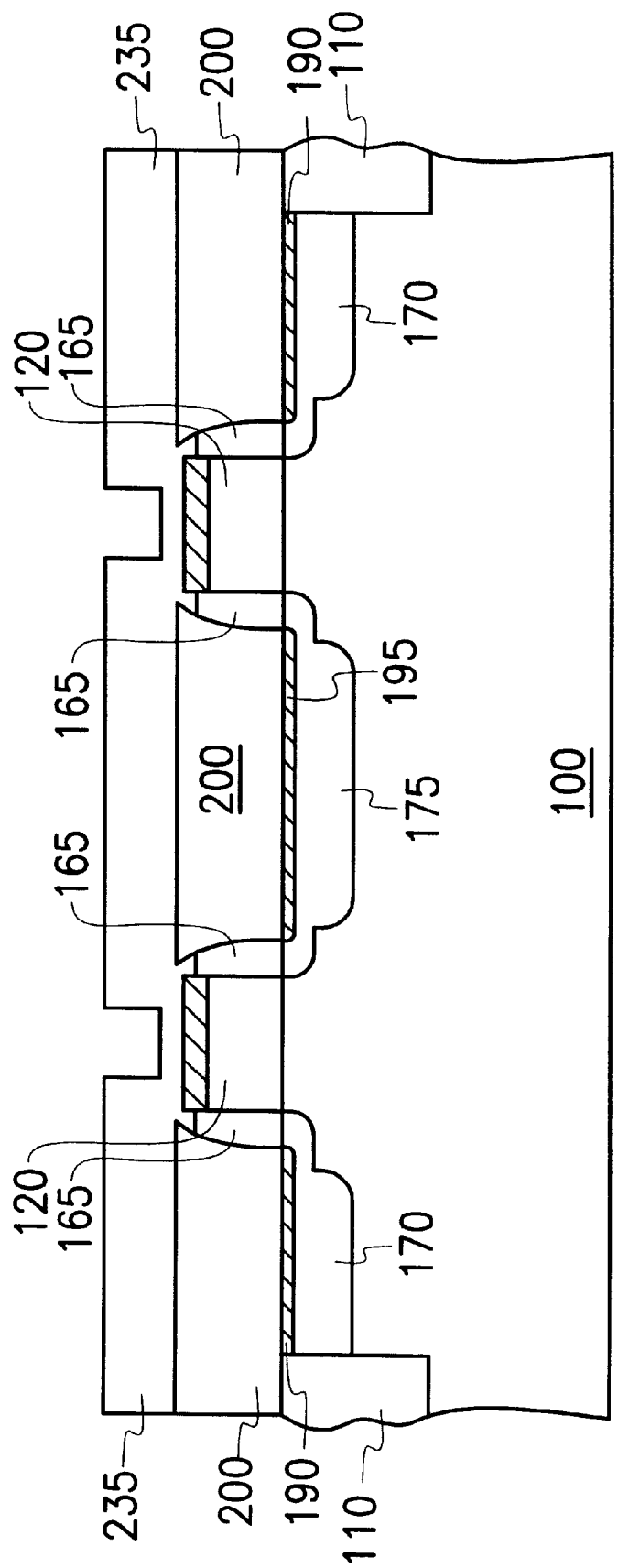

In FIG. 1H, a second thermal process is performed. Consequently, the metal layer 220 reacts with the polysilicon layer 120 on the gates 140 to produce a metal silicide layer 230. In the case of using a titanium layer as the metal layer 220, two stages are employed for the first thermal process. In the first stage, a temperature at about 620° C. to about 680° C. is maintained to form a titanium silicide layer in a C-49 phase. The second stage transforms the titanium silicide layer from the C-49 phase into a C-54 phase at a temperature ranged from about 800° C. to about 900° C. The metal layer 220 which does not react with the polysilicon layer 120 is removed. Should any metal nitirde layer is remained on the metal layer 220, it is removed together as the metal layer 220. A passavation layer 235 is formed on the insulation layer 200 and the gates 140 to cover the metal silicide layer 230.

Figure 1I:
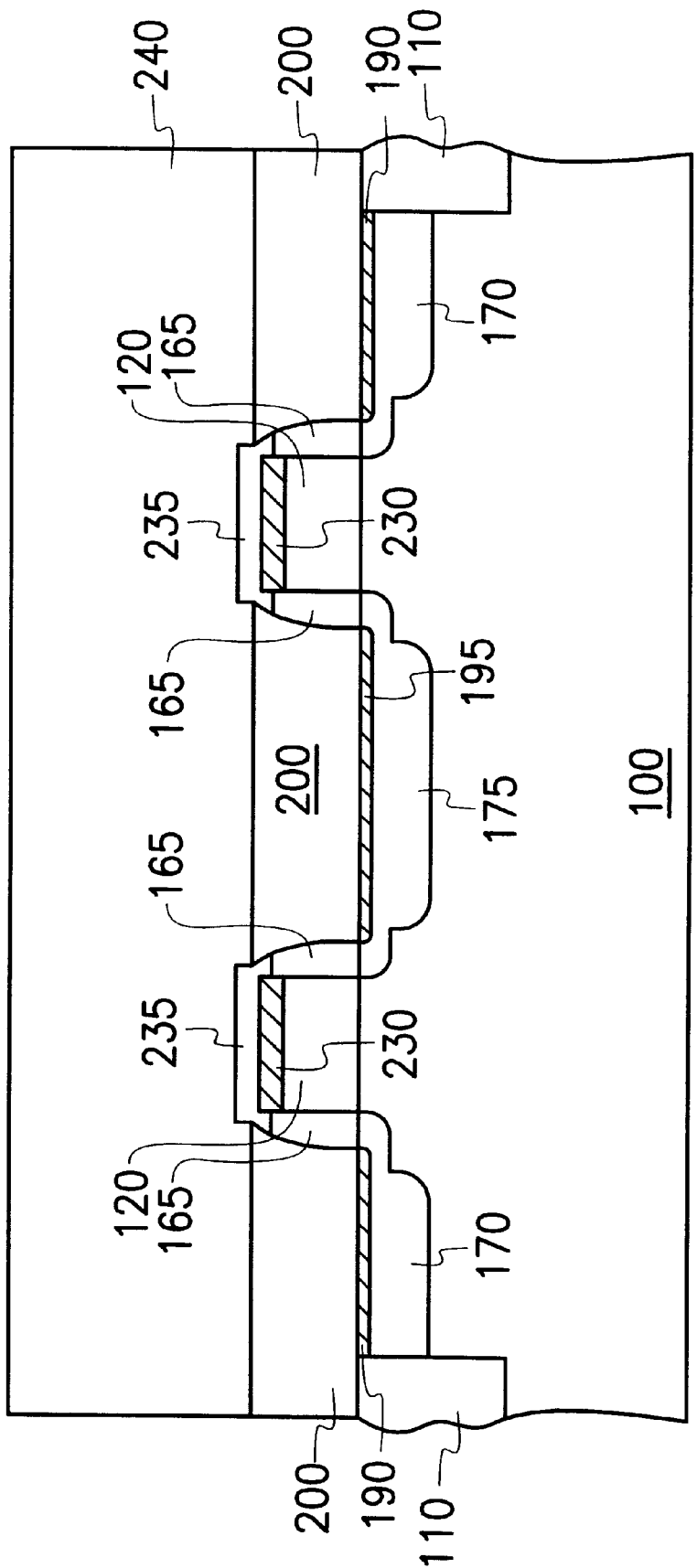

In FIG. 1I, using the insulation layer 200 as a stop layer, the passivation layer is planarized, for example, by chemical mechanical polishing (CMP). While the passivation layer is made of silicon nitirde, preferably, an etch back step is performed before the step of chemical mechanical polishing. The etch back step can be performed by using a hot phosphoric acid or plasma of $CH_3F$, $CHF_3$, and NF for a dry etch. An insulation layer 240 is formed on the insulation layer 200 and the passivation layer 235. For example, the insulation layer 240 comprises a silicon oxide layer formed by chemical vapor deposition. The insulation layer 240 is then planarized by, for example, chemical vapor deposition.

Figure 1J:
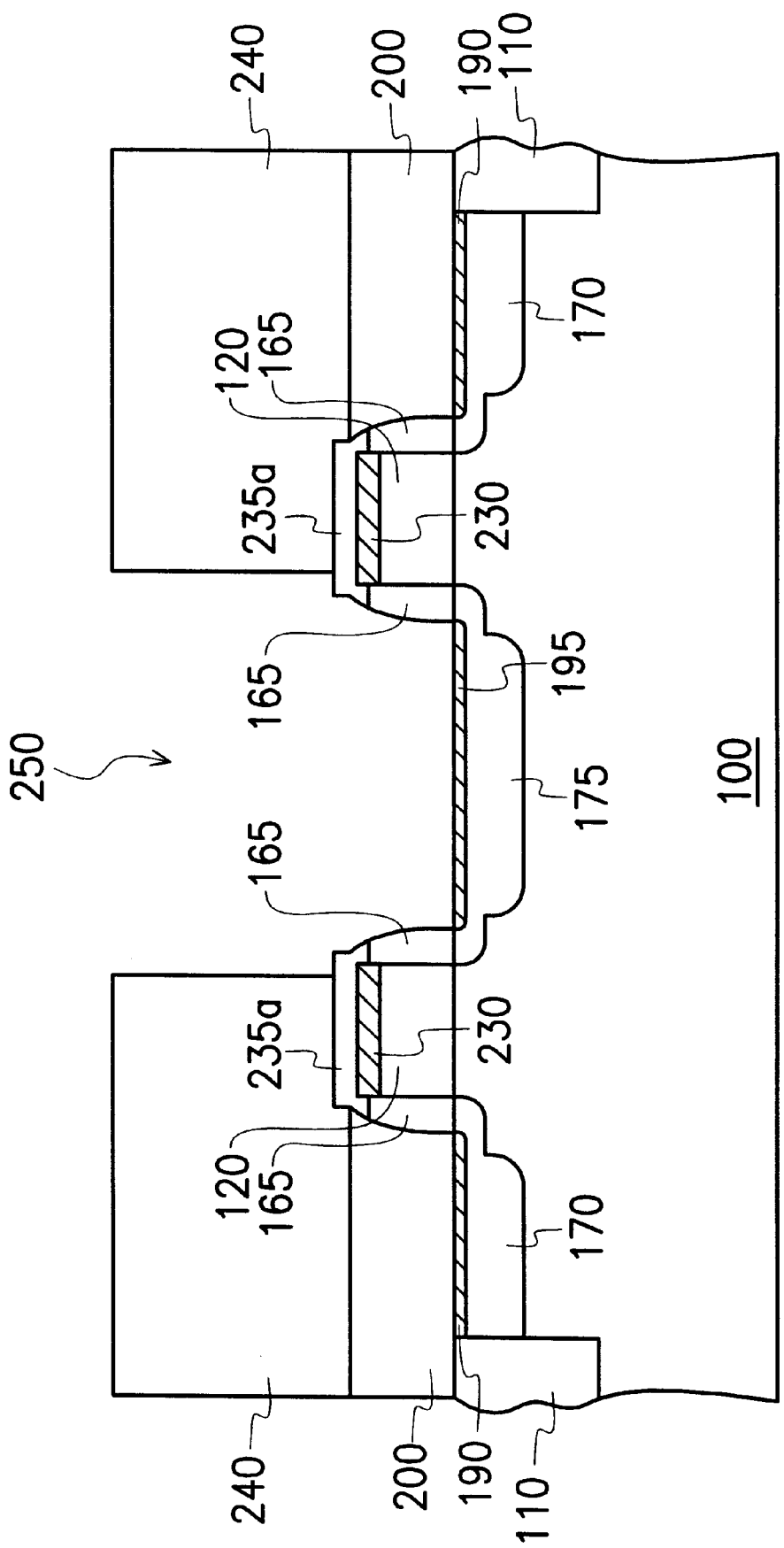

In FIG. 1J, parts of the insulation layers 200 and 240 are removed to form a contact window 250 which exposes the metal silicide layer 195 on common source/drain region 175. The following steps of forming a contact plug are a prior technique which is not described herewith further.

It is appreciated that people skilled in the art may also apply this invention in other fabrication process instead of forming a self-aligned contact window to expose a common source/drain region shared by two transistors or between two neighboring gates. For example, in the above-mentioned embodiment, after the formation of the self-aligned metal silicide, a contact window may also be formed to expose the source/drain region 170.

In the invention, a cap layer is formed to cover the gate while the metal silicde layer is formed on the source/drain regions. So that metal silicide layer is only formed on the source/drain regions. A metal silicide layer is formed after removing the cap layer. In this manner, there is no worry that a metal silicide may extend over the spacers to cause a bridging effect.

After the formation of the metal silicide layer on the gate, the metal silicide layer is covered with the passivation layer. Therefore, during the etching process for forming a contact window to expose the common source/drain, the gate is protected from being etched or damaged.

The pre-amorphous implantation step is performed on the gate only, so that the structure of the source/drain regions is not damaged thereby. Therefore, the possibility of causing the junction leakage is not minimized.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method for fabricating a self-aligned metal silicide layer applied in a process for forming a self-aligned contact window, the method comprising:

providing a substrate comprising at least two gates and a plurality of source/drain regions in the substrate, wherein the gates comprise a polysilicon layer and a cap layer on the polysilicon layer, and the source/drain regions comprise a common source/drain region these two gates;

forming a first metal silicide layer on the source/drain regions;

forming a first insulation layer covering the first metal silicide layer;

removing the cap layer;

performing a pre-amorphous implantation on the polysilicon layer;

forming a second metal silicide layer on the gate;

forming a passivation layer covering the second metal silicide layer;

forming a second insulation layer on the first insulation layer and the passivation layer; and forming a contact window penetrating through the second and the first insulation layers to expose the common source/drain region.

2. The method according to claim 1, wherein the gates further comprise a buffer layer formed between the polysilicon layer and the cap layer.

3. The method according to claim 1, wherein the first and the second metal silicide layers comprise cobalt silicide layers.

4. The method according to claim 1, wherein the first and the second metal silicide layers comprise titanium silicide layers.

5. The method according to claim 4, wherein the titanium suicide layers are formed by a thermal process comprising two stages at different temperature.

6. The method according to claim 5, wherein the two stages of the thermal process comprise a first stage performed at a temperature of about 620° C. to about 680° C., and a second stage performed at a temperature of about 800° C. to about 900° C.

7. The method according to claim 1, wherein the pre-amorphous implantation is performed with an ion source with a concentration of about $1\times10^{14}$ cm$^{-2}$ to $1\times10^{15}$ cm$^{-2}$ and with a implantation energy of about 80 KeV.

8. A method for fabricating a self-aligned metal silicide layer applied in a process for forming a self-aligned contact window, the method comprising:

providing a substrate comprising at least two gates and a plurality of source/drain regions in the substrate, wherein the gates comprise a polysilicon layer, a cap layer on the polysilicon layer and spacers on each sidewall of the gates, and the source/drain regions comprise a common source/drain region these two gates;

etching the spacers until a part of the sidewalls of the gates is exposed, so that the source/drain region is exposed with an enlarged surface;

forming a first metal silicide layer on the source/drain regions;

forming a first insulation layer covering the first metal silicide layer;

removing the cap layer;

performing a pre-amorphous implantation on the polysilicon layer;

forming a second metal suicide layer on the gate;

forming a passivation layer covering the second metal silicide layer;

forming a second insulation layer on the first insulation layer and the passivation layer; and forming a contact window penetrating through the second and the first insulation layers to expose the common source/drain region.

* * * * *